Sept. 29, 1953 W. SHOCKLEY 2,654,059

SEMICONDUCTOR SIGNAL TRANSLATING DEVICE

Filed May 26, 1951

INVENTOR
W. SHOCKLEY
BY [signature]
ATTORNEY

Patented Sept. 29, 1953

2,654,059

UNITED STATES PATENT OFFICE 2,654,059

SEMICONDUCTOR SIGNAL TRANSLATING DEVICE

William Shockley, Madison, N. J., assignor to Bell Telephone Laboratories, Incorporated, New York, N. Y., a corporation of New York Application May 26, 1951, Serial No. 228,483

12 Claims. (Cl. 317—235)

This invention relates to semiconductor signal translating devices and more particularly to such devices of the type disclosed in the application Serial No. 35,423, filed June 26, 1948 of W. Shockley, now Patent 2,569,347, granted September 25, 1951.

Devices of the type disclosed in the application above identified comprise, in general, a body of semiconductive material, for example germanium or silicon, having a zone of one conductivity type, N or P, sandwiched between two zones of the opposite conductivity type, and electrical connections to the three zones. In accordance with recognized nomenclature, the connection to the intermediate zone is termed the base and those to the outer zones are termed the emitter and collector respectively. In operation, in one manner, signals are impressed between the emitter and base and a load circuit is connected between the collector and base.

The performance characteristics are dependent upon, inter alia, the physical parameters of the intermediate zone. For example, in the case of devices operated as amplifiers, the upper limit for the frequency band of efficient operation is dependent upon the thickness of this zone, the limit becoming higher as the thickness decreases. Thus, for this and other applications, it is desirable that the intermediate zone be extremely thin, say less than a few mils thick. However, the construction of devices having such a thin zone involves the practical problem of establishing electrical connection to this zone. Even when very fine wires, say of diameter comparable to the thickness of this zone, are used there is danger of the wire bridging one or both the PN junctions. Also present is the possibility of the wire becoming displaced, as by jars, so that the connection to the intermediate zone is broken or an undesirable contact to two adjacent zones is established.

One general object of this invention is to facilitate and improve electrical connections to a restricted zone in a semiconductive body and especially to a thin zone of one conductivity type sandwiched between two zones of the opposite conductivity type.

In accordance with one feature of this invention, electrical connection to an intermediate zone such as discussed hereinabove is established by associating therewith a conductor of material which forms a substantially ohmic connection with semiconductive material of the conductivity type of the zone but forms a rectifying connection with semiconductive material of the opposite conductivity type.

In accordance with a more specific feature of this invention, in a translating device comprising a body of germanium or silicon having a thin P conductivity type zone between and contiguous with two N type zones, at least one NP junction extending inwardly from one surface of the body, connection to the P zone is effected by bonding thereto a wire of gold which straddles the junction mentioned. Gold, it has been found, forms a low resistance substantially ohmic junction with P type germanium and silicon but forms a rectifying junction with N type silicon or germanium. Thus, the bonded gold wire provides the desired and advantageous connection to the P zone and despite the fact that physically it straddles a PN junction, electrically it does not affect deleteriously the barrier due to the junction.

The invention and the above noted and other features thereof will be understood more clearly and fully from the following detailed description with reference to the accompanying drawing in which.

Figure 1:
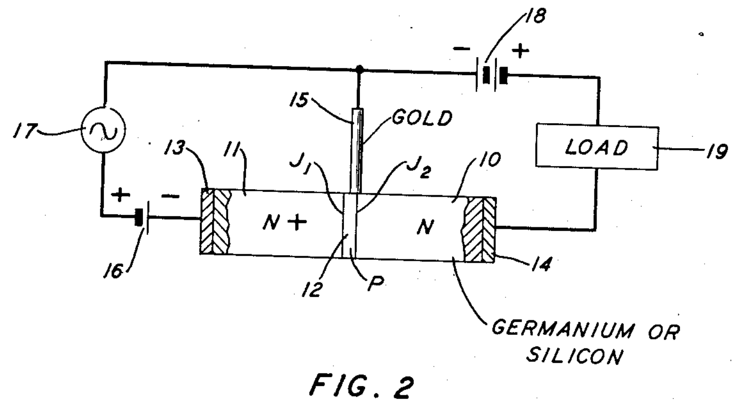
Fig. 1 is in part a diagram showing a semiconductive translating device and in part a circuit schematic illustrative of one embodiment of this invention.
Figure 2:
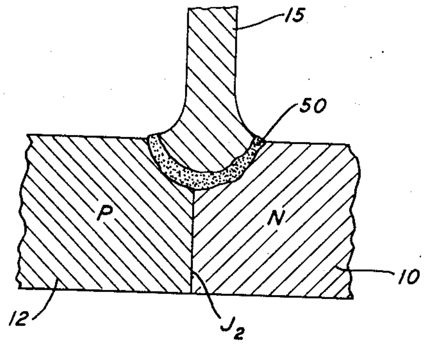
Fig. 2 is a sectional detail view to a greatly enlarged scale of a portion of the device illustrated in Fig. 1.

Referring now to the drawing, the device illustrated in Fig. 1 comprises a semiconductive body, for example of germanium or silicon, having therein end zones 10 and 11 of N conductivity type and a third zone 12 of P type, sandwiched between the end zones 10 and 11 and forming therewith PN junctions $J_1$ and $J_2$. The semiconductive body advantageously is of single crystal structure and may be fabricated in the manner disclosed in the application Serial No. 168,184, filed June 15, 1950 of G. K. Teal.

Advantageously, the two N zones have different conductivities and the zone 11 is of high conductivity relative to that of the zone 12. In a typical construction the conductivity of the zones 10, 11 and 12 may be respectively $\frac{1}{10}$ mho centimeter, 100 mho centimeter and 1 mho centimeter. In a typical device also the semiconductive body may be of square section 0.06 centimeter on a side, the P zone 12 may be 0.001 centimeter thick and the N zones 10 and 11 may be 0.15 centimeter thick.

Substantially ohmic connections 13 and 14, which may be for example metal platings, are provided to the N zones 11 and 10 respectively, these being termed the emitter and collector respectively. A third connection 15 termed the base and described in detail hereinafter is made to the P zone 12.

In the operation of the device as an amplifier, the emitter 13 is biased in the forward direction relative to the base by a direct current source 16 and input signals from a source 17 are impressed between the base and emitter. Amplified replicas of the input signals appear across the load 19 in circuit with the collector and base, the collector being biased in the reverse direction by a direct current source 18. The principles of operation involved are disclosed in detail in the application of W. Shockley identified hereinabove.

Advantageously, as has been noted heretofore, the intermediate zone 12 should be very thin, specifically of the order of 0.001 centimeter as in the specific embodiment mentioned above.

Figure 3:
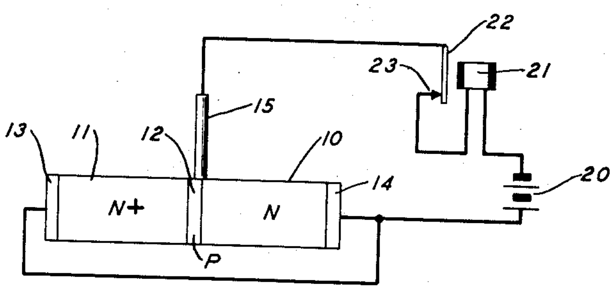
Fig. 3 is a diagram illustrating one manner in which the bonded connection illustrated in Fig. 2 may be made.

The base 15, in one specific embodiment, is constituted by a gold wire of the order of two mils diameter and as illustrated in Fig. 1 initially straddles the junction $J_2$. In the fabrication of the base connection, as illustrated in Fig. 3, the gold wire 15 is brought to bear endwise against one face of the semiconductive body and direct current from a source 20 is passed through the wire and body junction to bond the wire 15 to the body. Included in the bonding circuit is a relay 21 having an armature 22 and associated contact 23, which functions to open the circuit when a current of preassigned magnitude passes. The magnitude of the current traversing the circuit will be dependent, of course, upon the nature of the junction between the wire 15 and the semiconductive body.

As a result of the passage of current, a eutectic forms between the wire 15 and the semiconductive body whereby the wire is embedded in the body. It has been found that the gold wire thus bonded forms a substantially ohmic low resistance connection to the P zone 12. However, it has been found also that the junction between the wire 15 and N type zone 10, indicated at 50, is a rectifying one which acts akin to an extension of the junction $J_2$. Thus, it will be appreciated that in effect the bonded wire connection 15 serves really only as a connection to the P zone 12 and does not affect the performance of the junction $J_2$.

In the specific case involving a two mil gold wire and germanium material having conductivities of the order indicated hereinabove, a maximum current of 0.9 ampere in the bonding circuit has been found to be satisfactory, resulting in a mechanically strong and electrically good connection. In the case of gold wire to silicon body connections, a maximum current of 0.45 ampere in the bonding circuit has been found adequate.

Although in the specific embodiment described, the wire 15 was of gold, wires of other materials may be employed. A principal criterion for efficacy of the connection is that the wire be, act like or contain an acceptor material whereby it forms a rectifying junction with the N zone and a substantially ohmic connection with the P zone. Aluminum is illustrative of the acceptor materials which may be used for the wire and an alloy of gold and gallium is illustrative of wires containing acceptor material which may be utilized.

Also, although in the specific embodiment above described the gold wire establishes an ohmic connection to a P zone between two N zones, the invention is applicable also to the making of an ohmic connection to a thin N zone between two P zones. In this case, the wire 15 should be of a material which is, contains or acts like a donor thereby to form a rectifying junction with the P zone to which it is bonded. Illustrative of such are wires of platinum-ruthenium or tungsten coated or alloyed with a donor such as phosphorus or antimony.

Further, although in the specific embodiment described the wire 15 is bonded to the intermediate and one of the end zones, the invention may be embodied also in devices wherein the wire is bonded to all three zones. For example, an aluminum wire may be employed which initially straddles both the junctions $J_1$ and $J_2$ in a body such as illustrated in Fig. 1. After the bonding operation, the wire forms an ohmic connection to the P zone and rectifying connections to the two N zones, the wire to N zone contacts constituting in effect continuations of the junctions $J_1$ and $J_2$.

It is to be noted that in cases wherein the wire 15 is bonded to both the outer zones, the wire should be strongly of the conductivity type determining impurity characteristic of the conductivity type of the intermediate zone, in order to prevent substantial deterioration of the PN junctions by diffusion of impurities of the opposite class from the outer zones. For example, in a semiconductive body such as illustrated in Fig. 1 and having conductivities of the orders of magnitude set forth hereinabove, the zone 11 is rich in donors. Hence, during the bonding of a wire to the three zones, some of the donors might diffuse from the zone 11 to the junction between the wire and the N zone 10 and prevent the formation of a good rectifying barrier at this junction. However, if the wire is strongly acceptor in character, the effect of such diffusion of donors is overcome and the requisite rectifying junction is formed. In the case of an NPN configuration, aluminum has been found satisfactory as a connector bonded to all three zones for conductivities of the N zones up to about 100 mhos centimeter and gold has been found satisfactory for such connector for conductivities of the N zones up to about 3 mhos centimeter.

Similar considerations apply in cases of PNP configuration wherein the wire is bonded to the three zones. That is the wire should be highly donor in character to prevent the effect of diffusion of acceptor impurities upon the junctions.

Reference is made of the application Serial No. 184,870, filed September 14, 1950, of W. G. Pfann wherein a related invention is disclosed.

Although specific embodiments of this invention have been shown and described it will be understood that they are but illustrative and that various modifications may be made therein without departing from the scope and spirit of this invention.

What is claimed is:

1. A signal translating device comprising a body of semiconductive material having therein a pair of zones of opposite conductivity type meeting at a junction extending inwardly from one face of the body, a first connection to the body, and a second connection to said body at said face and physically straddling said junction, said second connection comprising a conductor bonded to said body and defining a substantially ohmic joint with one of said zones and a rectifying junction with the other of said zones.

2. A signal translating device in accordance with claim 1 wherein said conductor comprises an acceptor material.

3. A signal translating device in accordance with claim 1 wherein said conductor comprises a donor material.

4. A signal translating device in accordance with claim 1 wherein said body material is germanium.

5. A signal translating device in accordance with claim 1 wherein said body material is silicon.

6. A signal translating device comprising a body of semiconductive material having therein a zone of one conductivity type sandwiched between a pair of zones of the opposite conductivity type and defining a pair of PN junctions therewith, one of said junctions extending from one face of said body, a first connection to one of the outer zones, and a second connection to said body at said face and physically bridging said one junction, said second connection comprising a conductor of transverse dimensions greater than the width of the intermediate zone, bonded endwise to said body and defining a substantially ohmic contact to said intermediate zone and a rectifying contact to the outer zone bounding said one junction.

7. A signal translating device in accordance with claim 6 wherein said conductor is of gold.

8. A signal translating device in accordance with claim 6 wherein said conductor is of aluminum.

9. A signal translating device comprising a body of germanium having therein a pair of zones of N conductivity type on opposite sides of and contiguous with a zone of P conductivity type, the P zone defining with one of the N zones a junction extending inwardly from one surface of said body, electrical connections to the N zones, and a third connection comprising a wire of gold straddling said junction at said surface and bonded to the body.

10. A signal translating device comprising a body of semiconductive material having therein a P type zone sandwiched between two N type zones and defining therewith a pair of PN junctions extending inwardly from one face of said body, individual connections to said N type zones, and a third connection to said body comprising a conductor bonded endwise to said body at said face and straddling said junctions, said conductor forming a substantially ohmic connection to said P type zone and rectifying contacts with both said N type zones.

11. In the manufacture of a signal translating device comprising a body of semiconductive material having therein an N type zone and a P type zone forming a junction extending inwardly from one face of the body, the method of making an electrical connection to said body which comprises mounting a wire in engagement with said face and straddling said junction, said wire containing a conductivity type determining material, and passing a current through said wire and body to bond said wire to said body.

12. In the manufacture of a signal translating device comprising a body of semiconductive material having therein an N type zone and a P type zone forming a junction extending inwardly from one face of the body, the method of making an electrical connection to said body which comprises mounting a gold wire in endwise abutting contact with said face and straddling said junction, and passing current through said body and wire to bond said wire to said body.

WILLIAM SHOCKLEY.

References Cited in the file of this patent

UNITED STATES PATENTS

| Number | Name | Date |
|---|---|---|
| 1,390,243 | Laise | Sept. 6, 1921 |
| 2,145,651 | Funk | Jan. 31, 1939 |

OTHER REFERENCES

North-Journal of Applied Physics, November 1946, pages 912–915.